(12) United States Patent
Niwa et al.

(10) Patent No.: US 8,405,699 B2
(45) Date of Patent: Mar. 26, 2013

(54) LIGHT STABILIZER, LIGHT STABILIZATION METHOD, AND PRINTER

(75) Inventors: Yoshiaki Niwa, Kanagawa (JP); Takehiro Taniguchi, Tokyo (JP)

(73) Assignee: Sony Corporation, Tokyo (JP)

( * ) Notice: Subject to any disclaimer, the term of this patent is extended or adjusted under 35 U.S.C. 154(b) by 296 days.

(21) Appl. No.: 12/659,002

(22) Filed: Feb. 23, 2010

(65) Prior Publication Data

US 2010/0231683 A1    Sep. 16, 2010

(51) Int. Cl.
*B41J 2/435* (2006.01)
(52) U.S. Cl. ........................................ 347/236; 347/246
(58) Field of Classification Search .......... 347/236–238, 347/246, 247
See application file for complete search history.

(56) References Cited

U.S. PATENT DOCUMENTS

| | | | |
|---|---|---|---|
| 5,130,524 A * | 7/1992 | Egawa et al. | 250/205 |
| 7,697,184 B2 * | 4/2010 | Sakaue et al. | 359/212.1 |
| 7,769,064 B2 * | 8/2010 | Nagashima | 372/34 |

FOREIGN PATENT DOCUMENTS

JP    61-079285    4/1986

* cited by examiner

*Primary Examiner* — Hai C Pham
(74) *Attorney, Agent, or Firm* — Rader, Fishman & Grauer PLLC

(57) ABSTRACT

A light stabilizer used for an electronic device including a plurality of electronic parts including a light source, a main power source for supplying a drive current to the electronic parts, and a start button for the light source, wherein the light stabilizer comprises, a heating power source that supplies a heating current to the light source to make the light source self-heat in a non-light emitting state, and a control section that executes control so that after the main power source is turned on, the heating current is supplied to the light source firstly out of the plurality of electronic parts to increase temperature of the light source to the degree higher than dew point temperature, and when the start button is pressed down, the drive current is supplied to make the light source emit light.

7 Claims, 9 Drawing Sheets

LIGHT STABILIZER, LIGHT STABILIZATION METHOD, AND PRINTER

BACKGROUND OF THE INVENTION

1. Field of the Invention

The present invention relates to a light stabilizer used for stabilizing light source operation of a printer such as a laser printer and a copier, a light stabilization method, and a printer using the same.

2. Description of the Related Art

In the past, in such a printer, a laser diode as a light source is mounted on an encapsulated type package, for example, as illustrated in FIG. 13. In such a light source module 100, a heat sink 102 is arranged on a disc stem 101. A laser diode 106 is mounted on the heat sink 102 with a sub-mount 105 in between, and is sealed with a sealing cap 107. Laser light from the laser diode 106 is outputted outside through a window glass 108 provided on the front face of the sealing cap 107. Inside of the sealing cap 107 is filled with gas having lower dew-point temperature than temperature in external environment.

In the light source module 100, for airtight sealing, the sealing cap 107 and the stem 101 are fixed with each other by electric welding or brazing, and the sealing cap 107 and the window glass 108 are fixed with each other by low melting point glass or brazing. Similarly, lead pins 103a, 103b, and 103c are fixed to the stem 101 by low melting point glass, and thereby sealing and electric insulation are made. In addition, for a metal section of the stem 101 and the sealing cap 107, surface treatment is provided for facilitating joint of brazing or low melting point glass. For the window glass 108, plating treatment for brazing is provided.

Further, in the encapsulated type light source module 100, in the assembly step, the stem 101 on which the laser diode 106 is mounted is left in the gaseous atmosphere in which dew point is managed for a certain time. After moisture of the surface of the stem is extracted, the sealing cap 107 is electrically welded to the stem 101. Finally, presence of leakage is individually inspected by an apparatus such as a helium leakage checker. As described above, the light source module 100 in which the encapsulated type package is used should be manufactured through many steps. Thus, there has been a disadvantage that it costs a lot for assembly and inspection, and a major assembly equipment and a major inspection apparatus are necessitated.

Meanwhile, in the case where a printer is started in low temperature environment, there is a disadvantage that when the power source is turned on, temperature in the printer is increased, leading to dew condensation in the vicinity of the laser diode and the laser device itself. Further, in the case of printing, in some cases, if the inside of the light source module in which the laser device is heated is contacted with cool external air, dew condensation is shown in the window glass. Accordingly, in the past, the expensive light source module that is airtight-sealed as described above has been used.

In order to prevent dew condensation in such low temperature environment, a method of controlling temperature of a laser device by using a peltier device has been proposed (Japanese Unexamined Patent Application Publication No. 61-79285). That is, in the case where the module is exposed at lower temperature than dew point temperature, the laser device is heated up to the degree equal to or higher than the dew point temperature by the peltiert device. Thereby, without relation to the atmosphere temperature and humidity, dew condensation of the window glass is able to be prevented.

SUMMARY OF THE INVENTION

However, in the method of controlling temperature of the laser device by using the foregoing peltiert device, there has been a disadvantage that it is necessary to provide the expensive peltiert device and a power source for driving the same, leading to high cost. Further, there has been a disadvantage that the foregoing light source module 100 as a heating target includes a number of parts and has a high heat capacity, and thus it takes a long time for sufficient heating.

As described above, in the existing printer, in low temperature environment, there has been a disadvantage that it is difficult to promptly stabilize laser characteristics at the time of startup, that is, to stabilize print characteristics, or it is necessary to mount a mechanism on the printer for the purpose of stabilization, and further it takes a long time for startup. Further, there has been a disadvantage that stable laser characteristics are not able to be promptly obtained not only immediately after the main power source is turned on but also in the case where the printer is started up again after print standby.

It is desirable to provide a light stabilizer with which generation of dew condensation in a light source is able to be inhibited and stabilization of a printer is able to be realized with the use of an inexpensive and simple structure, a light stabilization method, and a printer using the same.

According to an embodiment of the invention, there is provided a first light stabilizer used for an electronic device equipping a plurality of electronic parts including a light source, a main power source for supplying a drive current to the electronic parts, and a start button for the light source. The first light stabilizer includes the following elements:

A1. a heating power source that supplies a heating current to the light source to make the light source self-heat in a non-light emitting state; and B1. a control section that executes control so that after the main power source is turned on, the heating current is supplied to the light source firstly out of the plurality of electronic parts to increase temperature of the light source to the degree higher than dew point temperature, and when the start button is pressed down, the drive current is supplied to make the light source emit light.

According to an embodiment of the invention, there is provided a first light stabilization method used for an electronic device equipping a plurality of electronic parts including a light source, a main power source for supplying a drive current to the electronic parts, and a start button for the light source. In the first light stabilization method, control is exercised as follows:

A2. after the main power source is turned on, a heating current is supplied to the light source firstly out of the plurality of electronic parts to make the light source self-heat in a non-light emitting state, and B2. when the start button is pressed down, a drive current is supplied to make the light source emit light.

According to an embodiment of the invention, there is provided a first printer including the foregoing first light stabilizer. The first printer has the following elements:

A3. a plurality of electronic parts including a light source;

B3. a main power source for supplying a drive current to the electronic parts;

C3. a start button for the light source;

D3. a heating power source that supplies a heating current to the light source to make the light source self-heat in a non-light emitting state; and E3. a control section that executes control so that after the main power source is turned on, the heating current is supplied to the light source firstly out of the plurality of electronic parts to increase temperature of the light source to the degree higher than dew point temperature, and when the start button is pressed down, the drive current is supplied to the light source to make the light source emit light.

In the first light stabilizer, the first light stabilization method, and the first printer of the embodiments of the invention, when the main power source is turned on, the heating current is supplied to the light source firstly out of the plurality of electronic parts, that is, before the electronic parts other than the light source, and temperature of the light source is heated to the degree equal to or higher than dew point temperature before the other electronic parts. Thereby, generation of dew condensation is inhibited. After that, when the start button is pressed down, the drive current is supplied to the light source to make the light source emit light.

According to an embodiment of the invention, there is provided a second light stabilizer including the following elements:

A4. a light blocking means that blocks entrance of light from the light source into an irradiation object; and B4. a control section that executes control so that after the main power source is turned on, the drive current is supplied to the light source firstly out of the plurality of electronic parts to increase temperature of the light source to the degree higher than dew point temperature, and entrance of light outputted from the light source into the irradiation object is blocked by driving the light blocking means, and when the start button is pressed down, driving the light blocking means is released.

According to an embodiment of the invention, there is provided a second light stabilization method. In the second light stabilization method, control is exercised as follows:

A5. after the main power source is turned on, while a drive current is supplied to the light source firstly out of the plurality of electronic parts to increase temperature of the light source to the degree higher than dew point temperature, entrance of light outputted from the light source into an irradiation object is blocked by a light blocking means, and B5. after the main power source is turned on, while a drive current is supplied to the light source firstly out of the plurality of electronic parts to increase temperature of the light source to the degree higher than dew point temperature, entrance of light outputted from the light source into an irradiation object is blocked by a light blocking means, and when the start button is pressed down, driving the light blocking means is released.

According to an embodiment of the invention, there is provided a second printer including the foregoing second light stabilizer. The second printer has the following elements:

A6. a plurality of electronic parts including a light source;

B6. a main power source for supplying a drive current to the electronic parts;

C6. a start button for the light source;

D6. a light blocking means that blocks entrance of light from the light source into an irradiation object; and E6. a control section that executes control so that after the main power source is turned on, the drive current is supplied to the light source firstly out of the plurality of electronic parts to increase temperature of the light source to the degree higher than dew point temperature, and entrance of light outputted from the light source into an irradiation object is blocked by driving the light blocking means, and when the start button is pressed down, driving the light blocking means is released.

In the second light stabilizer, the second light stabilization method, and the second printer of the embodiments of the invention, when the main power source is turned on, the drive current is supplied to the light source firstly out of the plurality of electronic parts, that is, before the electronic parts other than the light source, and thereby temperature of the light source is heated to the degree equal to or higher than dew point temperature. Thereby, generation of dew condensation is inhibited. Meanwhile, light is outputted from the light source, but the light is blocked by the light blocking means before the irradiation object such as a photoconductive drum. After that, when the start button is pressed down, driving the light blocking means is released.

According to the light stabilizer and the light stabilization method of the embodiments of the invention, the light source is heated firstly out of the plurality of electronic parts composing an electronic device. Thus, an open type package is able to be used, generation of dew condensation is able to be inhibited and stability of the light source characteristics are able to be realized with an inexpensive structure. Thus, in the printer applying the light stabilizer, the print characteristics are stabilized.

Other and further objects, features and advantages of the invention will appear more fully from the following description.

DETAILED DESCRIPTION OF THE PREFERRED EMBODIMENTS

Embodiments of the invention will be hereinafter described in detail with reference to the drawings. The description will be given in the following order.

Figure 1:
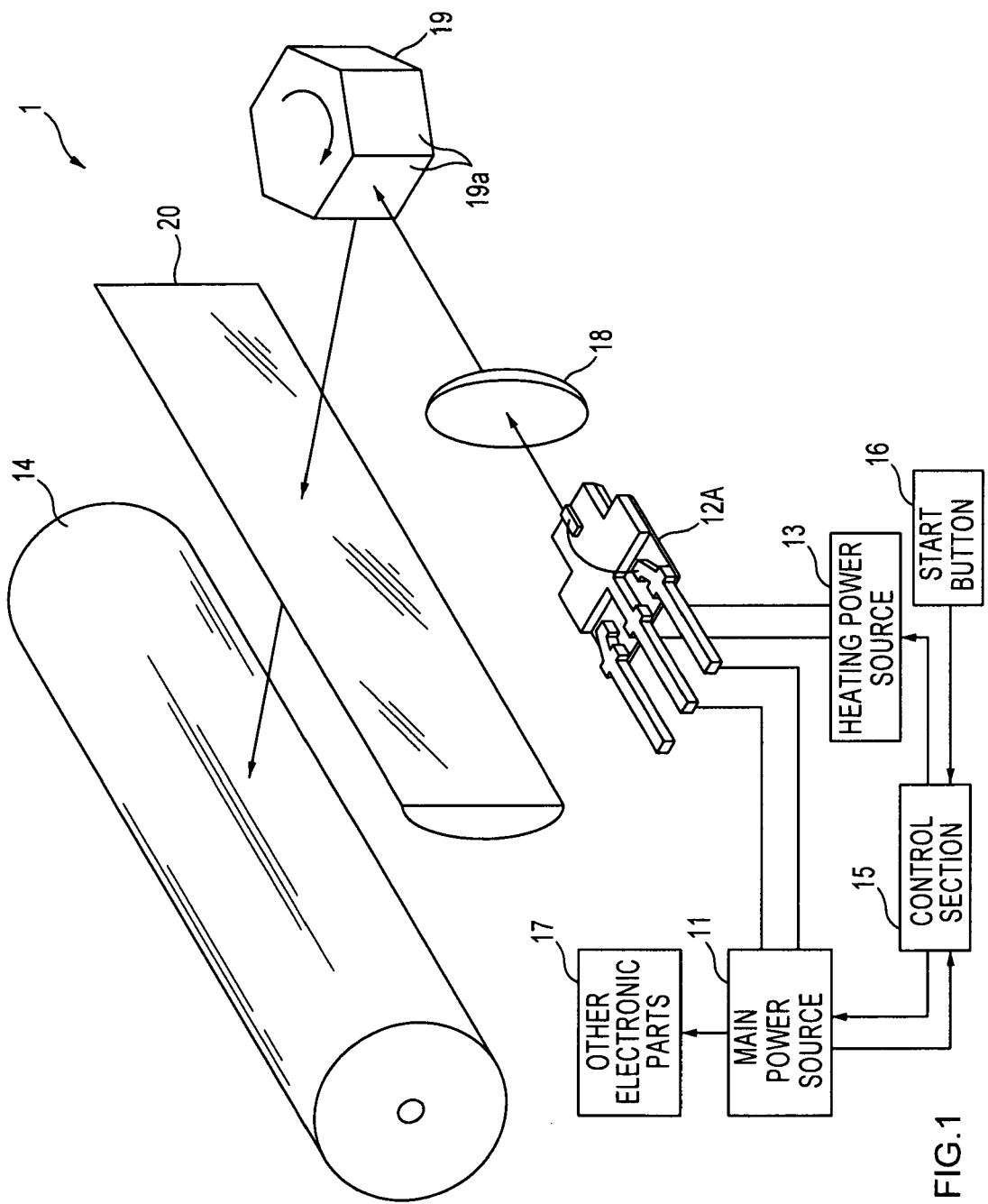
FIG. 1 is a perspective view illustrating a schematic structure of a printer according to a first embodiment of the invention.

1. First embodiment (example that temperature of a laser light source is increased by applying a current to the degree that laser light is not outputted)
2. Second embodiment (example that temperature sensors, a humidity sensor, and a control section are included)
3. Third embodiment (example that a laser device is heated by using an auxiliary heating device)
4. Fourth embodiment (example that temperature of a laser light source is increased and laser light is blocked by a shutter)
5. Modified example 1. First Embodiment Structure of Printer FIG. 1 illustrates a structure of a printer according to a first embodiment of the invention. The printer is specifically a laser printer (or a copier), and a light stabilizer (method) of the invention is used therefor. A printer 1 includes a main power source 11, a light source module 12A, a heating power source 13, a photoconductive drum 14, a control section 15, a print start button 16, and other electronic parts 17. In the light path between the light source module 12A and the photoconductive drum 14, a collimator lens 18, a polygon mirror 19, and an f-θ lens 20 are arranged. In this embodiment, while the light source module 12A is also referred to as an electronic part, sections other than the light source module 12A driven by the main power source 11 such as a scanner are referred to as other electronic parts 17.

Figure 2:
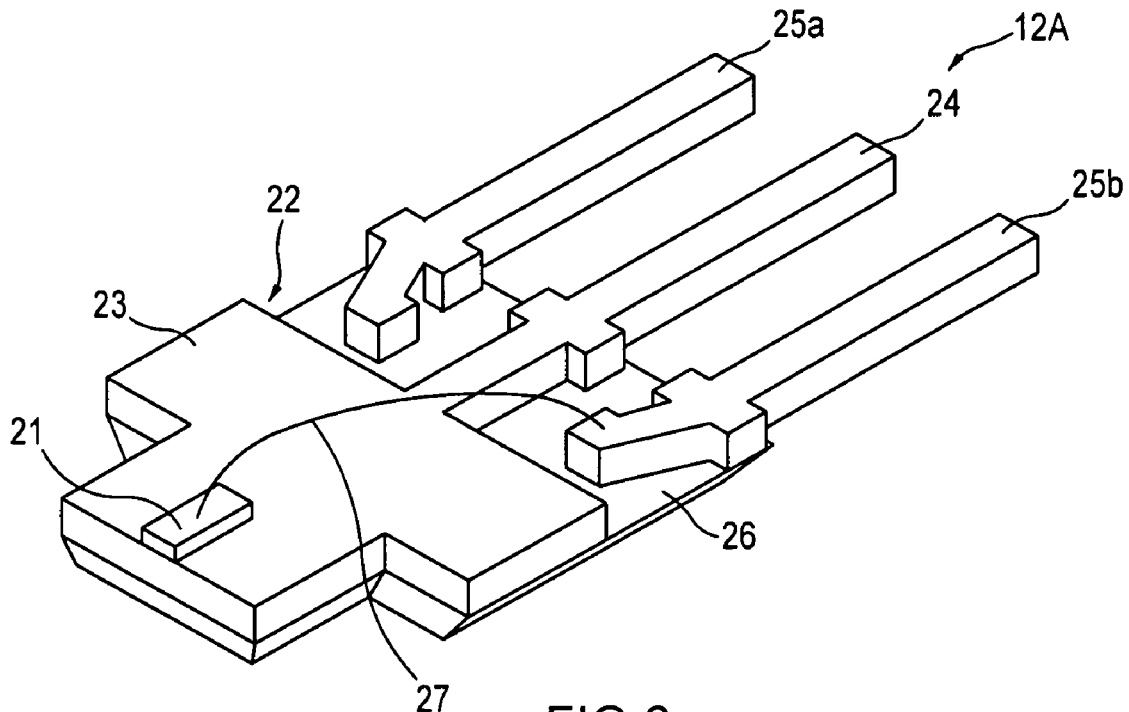
FIG. 2 is a perspective view of a light source module.

As the enlarged view illustrated in FIG. 2, in the light source module 12A, a laser diode 21 is mounted on an open type package 22 (open package). The package 22 is structured by integrating a lead frame 24 including an arrangement region of the laser diode 21 (die pad 23) and lead terminals 25a and 25b with the used of a resin 26. The lead frame 24 and the lead terminals 25a and 25b are formed from a metal having favorable heat conductivity and small electric resistance such as Cu (copper) and Fe (iron), or an alloy having such a metal as a main component.

The laser diode 21 is bonded with the die pad 23 by an conductive binder such as Au—Sn (gold-tin) eutectic solder, SnAgCu (tin-silver-copper) solder, indium system solder with low melting point, and a conductive adhesive. As solder, solder evaporated on the die pad 23 or pellet-like solder is able to be used. An end of a wire 27 composed of Au (gold) or the like is jointed onto the laser diode 21 (for example, a p-side electrode), and the other end of the wire 27 is jointed to the lead terminal 25b. That is, each current from the main power source 11 and the heating power source 13 is respectively supplied to the laser diode 21 through the lead terminal 25b and the lead frame 24. In this embodiment, the laser diode 21 is an edge emitting laser. The laser diode 21 may be a single beam laser having one light emitting section, and may be a multibeam laser having two or more light emitting sections.

The main power source 11 is intended to supply a drive current to the light source module 12A and the other electronic parts 17. In this embodiment, in the case where the main power source 11 is turned on, such an ON signal is sent to the control section 15. The heating power source 13 is intended to supply a heating current to the laser diode 21 and make the laser diode 21 self-heat up to temperature equal to or higher than dew point temperature in a state of non light emitting under control of the control section 15.

Figure 3:
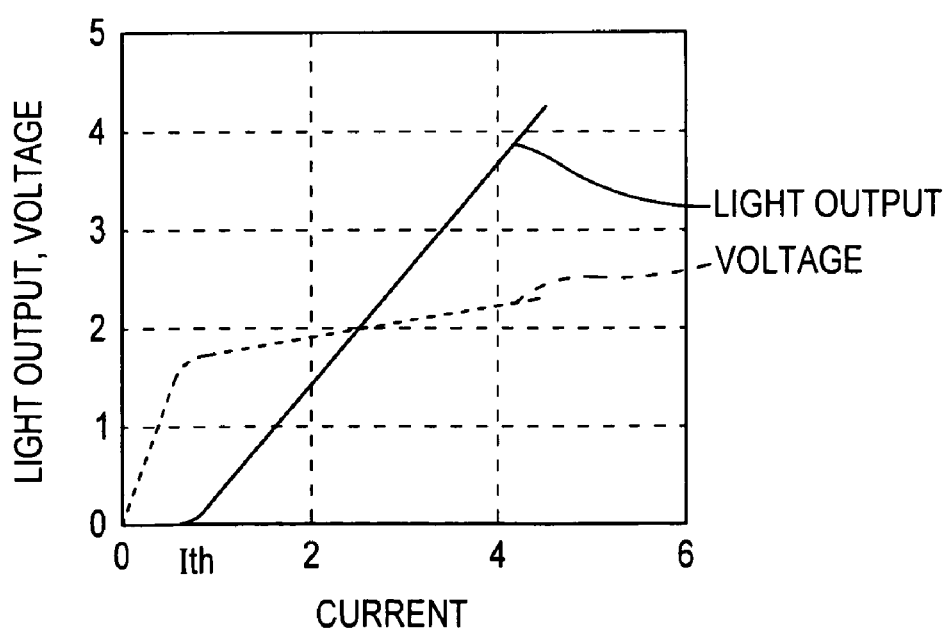
FIG. 3 is a characteristics diagram illustrating a relation between a current value supplied to a laser device and a light output of laser light/an applied voltage value.

FIG. 3 illustrates a relation between a voltage/a light output and a current supplied to the laser diode 21. As illustrated in FIG. 3, in the laser diode 21, no laser oscillation is generated from starting current application until oscillation threshold current value (Ith), and laser oscillation is firstly generated when a current is further increased to the degree equal to or higher than the oscillation threshold. Meanwhile, for heat exhaustion, all input power is exhausted as heat in the case where a current value is under the oscillation threshold, and a portion obtained by subtracting light emitting output from input power is exhausted as heat after starting oscillation. In the specification, the current under the oscillation threshold is referred to as a heating current, and the current equal to or higher than the oscillation threshold is referred to as a drive current to the laser diode 21. That is, by being applied with the heating current, the laser diode 21 does not emit light (non-light emitting state), self-heats to increase the temperature to the degree equal to or higher than dew point. Meanwhile, by being applied with the drive current, the laser diode 21 generates light output.

The control section 15 receives an ON signal from the main power source 11 and a print start signal from the start button 16, and controls the main power source 11 and the heating power source 13 by the following respective procedures.

That is, when the control section 15 receives the ON signal from the main power source 11, the control section 15 executes control so that the heating power source 13 supplies a heating current to the laser diode 21 firstly out of the plurality of electronic parts, that is, before the other electronic parts 17, or the heating power source 13 supplies a heating current to the laser diode 21 concurrently with its supplying a heating current to one or more of the other electronic parts 17. Thereby, temperature of the laser diode 21 is increased to the degree higher than dew point temperature, and inhibits generation of dew condensation. After that, when the print start button 16 is pressed down, the control section 15 executes control so that the main power source 11 supplies a current equal to or higher than a threshold (drive current) to make the laser diode 21 emit light, and print operation such as exposure is started.

In this embodiment, the heating power source 13 is illustrated as a power source different from the main power source 11. However, if an output of the main power source 11 is lowered down to a desired level by using, for example, an DC/DC converter, the number of parts is able to be reduced. Of the foregoing elements, the heating power source 13 and the control section 15 comprise "light stabilizer" of the invention.

The collimator lens 18 changes laser light outputted from the light source module 12A to approximately parallel light. The polygon mirror 19 has a plurality of reflecting mirrors 19a on the side faces thereof, and polarizes laser light by motor drive. Further, the f-θ lens 20 provides an image of laser light on the surface of the photoconductive drum 14, and adjusts the scanning rate of laser light on the photoconductive drum 14 to a uniform rate.

Action

Next, a description will be given of action of the printer 1 of this embodiment with reference to the timing charts of FIG. 4A to FIG. 4D.

Figure 4:
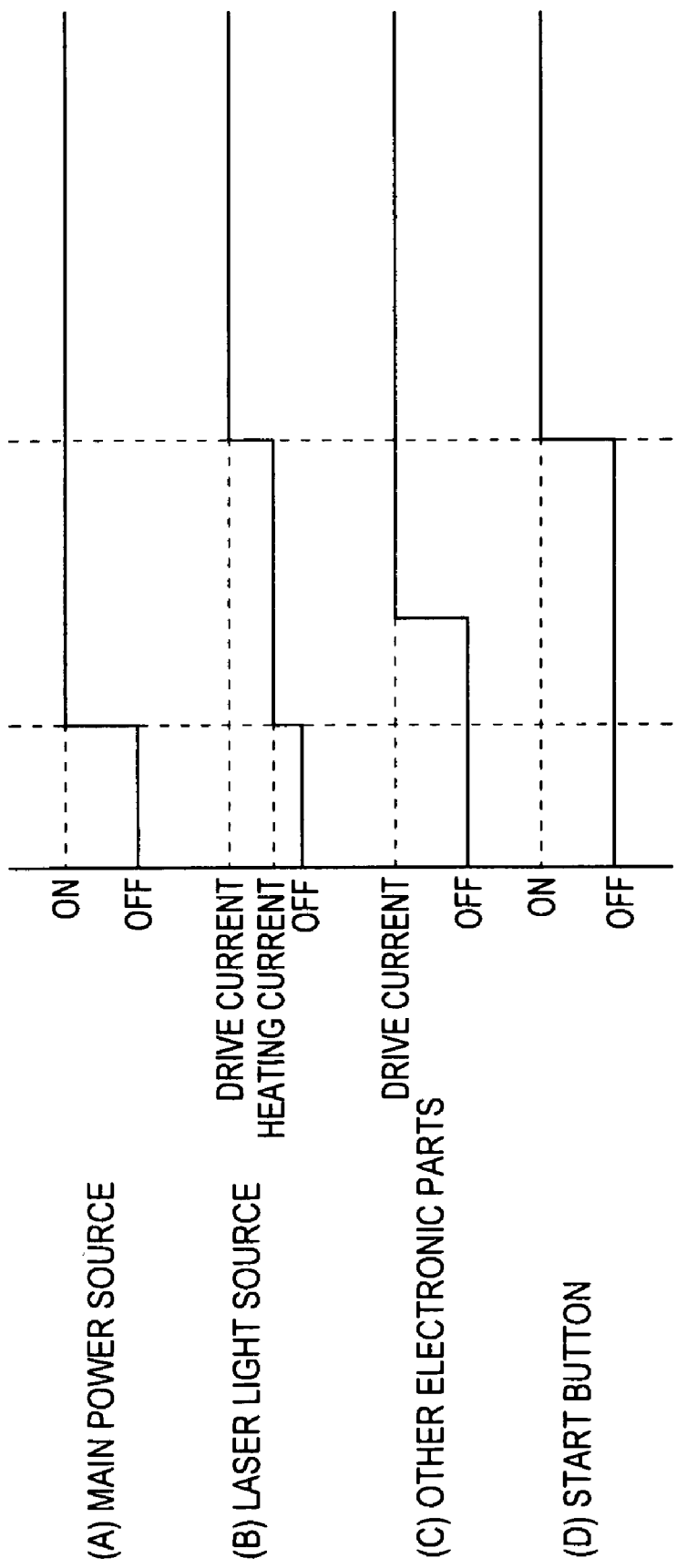
FIGS. 4A to 4D are timing charts for explaining operation of the printer.

First, the main power source is turned on (FIG. 4A). At the same time, the control section 15 drives the heating power source 13 to supply a heating current to the laser diode 21 of the light source module 12A (FIG. 4B). In the laser diode 21, though the heating current is supplied, since the current value is under than threshold, laser light is not outputted, and the supplied current is all converted to heat. Further, not only temperature of the laser diode 21 is increased, but also temperature of the package 22 on which the laser diode 21 is mounted is increased. However, since the heat capacity thereof is small, such increased temperature immediately reaches the degree equal to or higher than dew point temperature.

In the case where temperature of the light source module 12A becomes the degree equal to or higher than dew point temperature as described above, the control section 15 executes control so that the main power source 11 supplies a drive current to the other electronic parts 17 such as a scanner (FIG. 4C). Thereby, the other electronic parts 17 are driven. Even if the drive current is supplied to the other electronic parts 17 and temperature is increased as above, since the laser diode 21 and the light source module 12A have been already heated and the temperature thereof has reached the degree equal to or higher than dew point temperature, dew condensation is not generated in the laser diode 21 and the light source module 12A. In this state, the printer 1 becomes in standby state.

Timing when the main power source 11 supplies the drive current to the other electrical parts 17 may be concurrent with timing when the heating current is supplied to the light source module 12A.

After that, when the start button 16 is pressed down and is turned on (FIG. 4D), the control section 15 starts printing. That is, the control section 15 exercises control so that the heating power source 13 stops supplying the heating current to the light source module 12A, and the main power source 11 supplies a drive current to the light source module 12A. In this case, since the drive current is a current equal to or higher than a threshold, laser light is outputted from the laser diode 21. The laser light is changed to approximately parallel light by the collimator lens 18, and then enters the polygon mirror 19. The polygon mirror 19 is rotated by a motor (not illustrated). Such rotation continuously changes incident angle of laser light to the respective reflecting mirrors 19a, which polarizes the laser light. The laser light reflected by the polygon mirror 19 is scanned in the axis line direction of the photoconductive drum 14. Further, the reflected laser light is scanned by the f-θ lens 20 at a uniform rate, and an image of the laser light is provided on the photoconductive drum 14. After that, through a transfer step, printing is finished.

Effect

As described above, in this embodiment, after the control section 15 receives the ON signal from the main power source 11, the heating current is supplied to the laser diode 21 firstly out of the plurality of electronic parts, that is, before the other electronic parts 17, or the heating current is supplied to the laser diode 21 concurrently with supplying the heating current to the other electronic parts 17. Thereby, the laser diode 21 is able to be self-heated in a non-light emitting state, temperature of the light source module 12A is able to be increased to the degree higher than dew point temperature, and generation of dew condensation is able to be inhibited.

In particular, in this embodiment, the open type package 22 is used as the light source module 12A. Thus, the heat capacity of the light source module 12A is decreased, and if a heating current is supplied, the light source module 12A is immediately heated. Therefore, dew condensation is able to be more effectively inhibited. Further, if the electricity is supplied to the other electronic parts 17 concurrently with supplying the heating current to the laser diode 21, since the light source module 12A is heated before the other electronic parts 17, dew condensation in the light source module 12A is able to be securely prevented. That is, even if the printer 1 is started in low temperature environment, stable laser characteristics and stable print characteristics are able to be obtained promptly.

Further, in the past, it has been necessary to heat the whole encapsulated type package including the window glass. Thus, the heat capacity is increased, and about 1 minute heating time is necessitated. Meanwhile, in this embodiment, as described above, the heat capacity until temperature of the light source module 12A is increased to the degree equal to or higher than dew point temperature is small. Thus, the whole laser diode 21 is able to be heat-saturated within 1 second, and uniform temperature is able to be obtained. Accordingly, startup time of the printer 1 is able to be largely shortened compared to the existing startup time.

Further, since the open type package 22 is used as the light source module 12A, it is not necessary to use a major assembly equipment for assembling the light source module 12A. Further, since it is enough to perform only laser characteristics evaluation for product inspection of the light source module 12A, the number of types of inspection apparatuses may be small. Accordingly, cost for assembling and inspecting the light source module 12A is lower compared to the existing cost. In result, manufacturing cost of the printer 1 becomes inexpensive.

The heating current to the light source module 12A is not only supplied at the time when the main power source 11 is turned on, but may be always supplied. Thereby, even if the print interval is long, dew condensation of the light source module 12A is able to be prevented, and time to restart the printer 1 is able to be shortened.

A description will be given of other embodiments of the invention. In the following description of the other embodiments, for the same elements as those of the first embodiment, the same referential symbols are affixed thereto, and detailed description thereof will be omitted.

2. Second Embodiment

Figure 5:
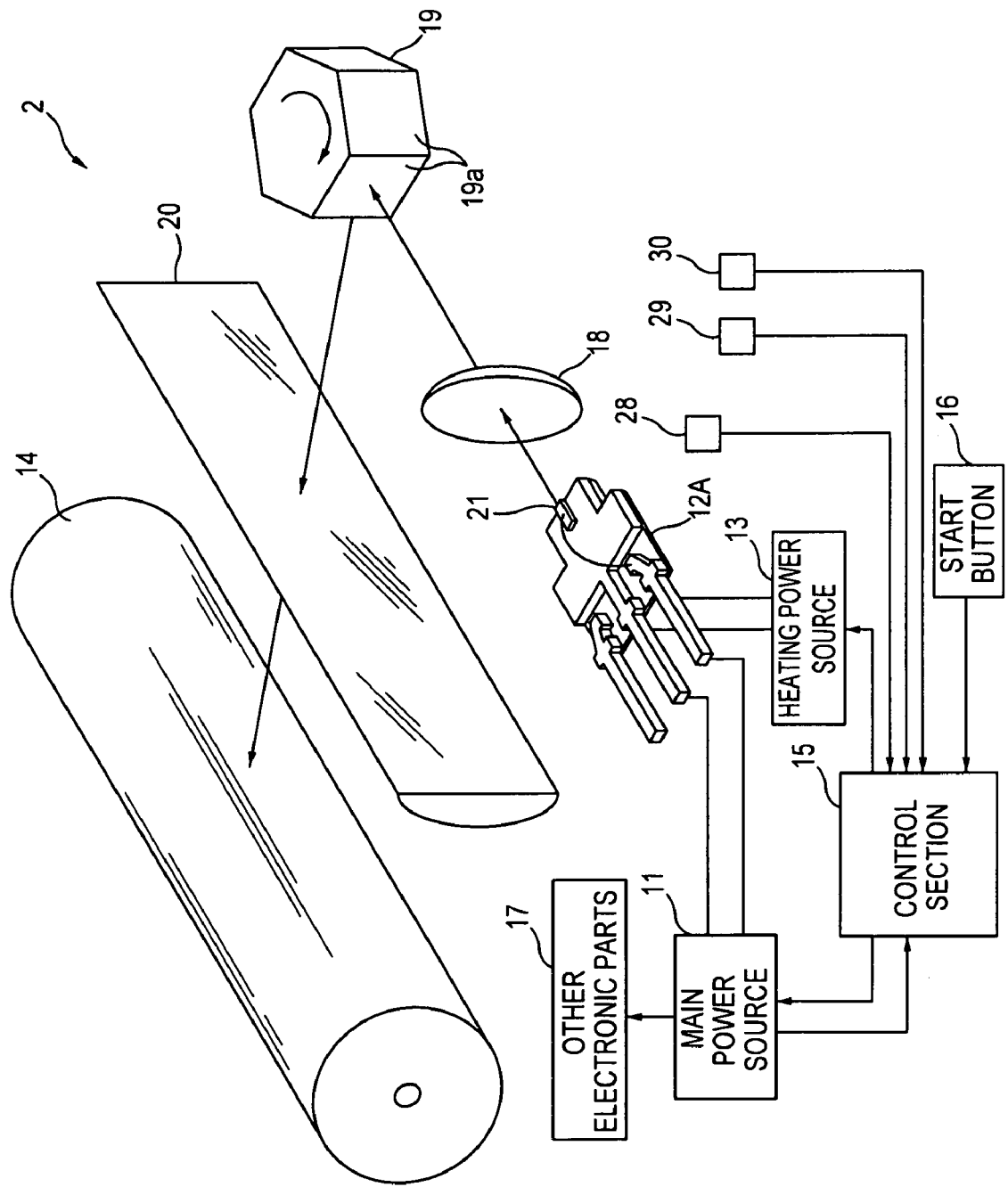
FIG. 5 is a perspective view illustrating a schematic structure of a printer according to a second embodiment of the invention.

FIG. 5 illustrates a structure of a printer according to a second embodiment of the invention. A printer 2 is different from the printer 1 of the first embodiment in that temperature sensors 28 and 29 and a humidity sensor 30 are included. The temperature sensor 28 measures temperature of the light source module 12A, the temperature sensor 29 measures temperature of ambient environment of the light source module 12A, and the humidity sensor 30 measures humidity of the ambient environment of the light source module 12A respectively.

Measurement results of the temperature sensors 28 and 29 and the humidity sensor 30 are sent to the control section 15. That is, in this embodiment, the control section 15 executes control in the same manner as that of the first embodiment, except that by further considering the measurement results of the temperature sensor 29 and the humidity sensor 30, heating current size is adjusted to prevent temperature of the laser diode 21 from being lowered down to temperature equal to or less than dew point temperature, and power consumption is optimized. The heating current size is adjusted by preparing a plurality of power sources with each output different from each other as the heating power source 13, and switching among the plurality of heating power sources as appropriate. It is needless to say that in this case, as described above, it is desirable that an output of the main power source 11 is incrementally lowered down to a desired level by using an DC/DC converter.

In this embodiment, dew point temperature of ambient environment of the light source module 12A is obtained by the temperature sensor 29 and the humidity sensor 30, and the dew point temperature is compared to the measurement result of the temperature sensor 28. In the case where the temperature measured by the temperature sensor 28 is lower than the dew point temperature, the heat power source 13 is controlled to increase a current value of the heating current. Even if the current value of the heating current is increased, the current value never becomes a degree equal to or higher than light emitting threshold. Thereby, temperature of the light source module 12A is increased to retain temperature equal to or higher than the dew point temperature, and generation of dew condensation is able to be prevented. Other action and effect are similar to those of the first embodiment.

3. Third Embodiment

Figure 6:
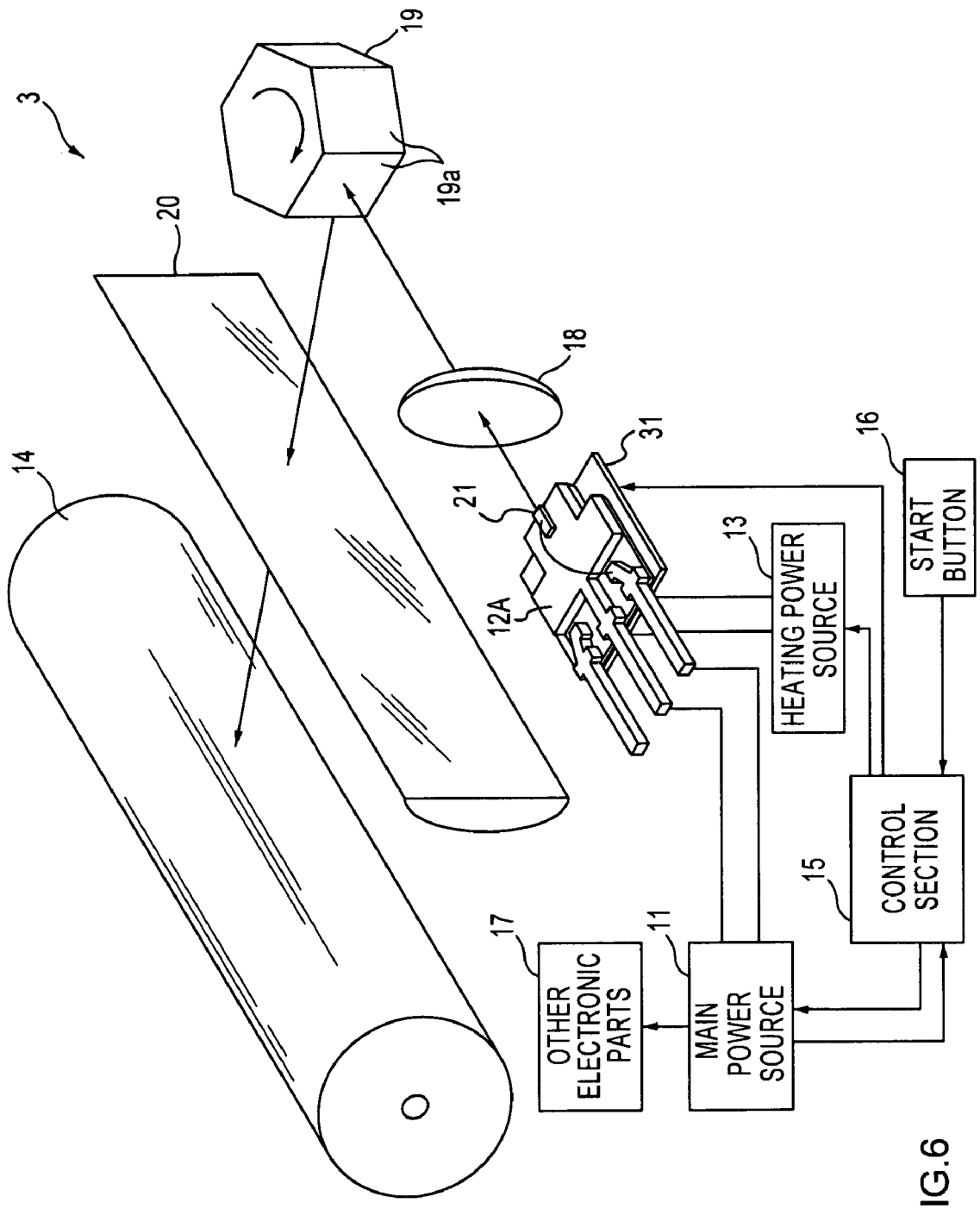
FIG. 6 is a perspective view illustrating a schematic structure of a printer according to a third embodiment of the invention.

FIG. 6 illustrates a structure of a printer according to a third embodiment of the invention. A printer 3 is different from the printer 1 according to the first embodiment in that an auxiliary heating section (heater) 31 is included. The auxiliary heating section 31 is arranged in the vicinity of the laser diode 21, aids self heating by the foregoing heating current under control of the control section 15, that is, secondarily and externally increases temperature of the laser diode 21 and the light source module 12A.

In the printer 3, when the power source 11 is turned on, a heating current is concurrently supplied from the heating power source 13 to the light source module 12A, and the light source module 12A is heated. In addition, a current is supplied to the auxiliary heating section 31, and thereby temperature of the auxiliary heating section 31 is increased. In result, the light source module 12A is heated faster than in the foregoing embodiments. Even if the printer 3 is in a print standby state, both self heating by the heating current and external heating by the auxiliary heating section 31 may be used together. Further, when the printer 3 starts print operation, heating of the light source module 12A by the auxiliary heating section 31 is stopped or heating level is lowered, and thereby temperature at which desired laser characteristics of the light source module 12A are obtained is realized.

It is possible that the printer 3 includes the temperature sensor 28, the temperature sensor 29, and the humidity sensor 30 described in the second embodiment, and the auxiliary heating section 31 is controlled based on the measurement results thereof.

Further, it is possible that a threshold is previously set to temperature measured by the temperature sensor 28, and at the time when measurement temperature of the temperature sensor 28 becomes the degree equal to or higher than the threshold, heating the laser diode 21 by the auxiliary heating section 31 is stopped. Thereby, it becomes possible to prevent temperature of the laser diode 21 from being excessively increased.

Further, it is possible that a heating amount to prevent generation of dew condensation in the light source module 12A is calculated based on measurement results of the temperature sensor 28, the temperature sensor 29, and the humidity sensor 30. That is, a heating current is supplied from the heating power source 13 to the light source module 12A and power is supplied to the auxiliary heating section 31 as appropriate so that such a heating amount is able to be obtained. Thereby, the light source module 12A is able to be effectively heated.

4. Fourth Embodiment

Figure 7:
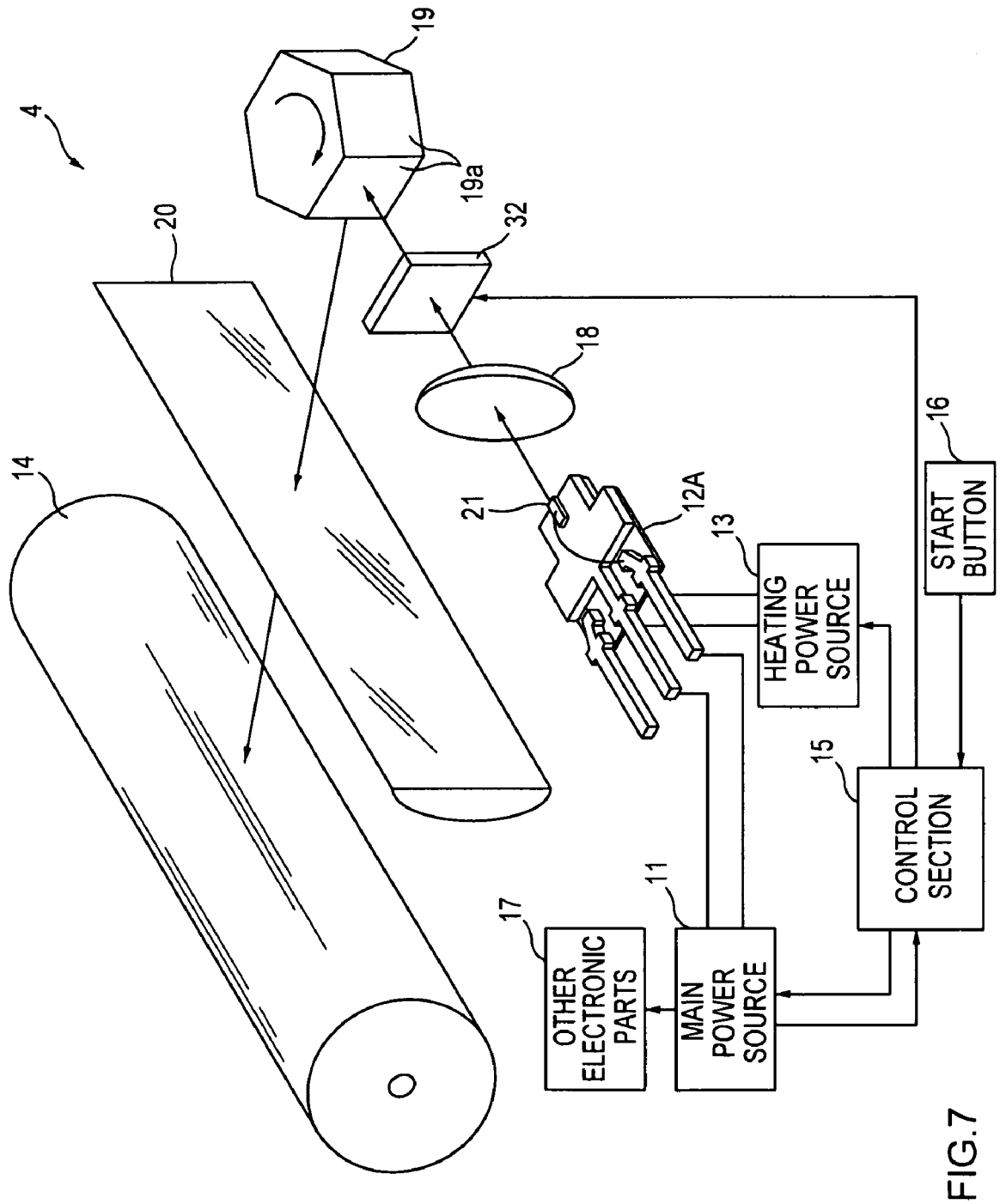
FIG. 7 is a perspective view illustrating a schematic structure of a printer according to a fourth embodiment of the invention.

FIG. 7 illustrates a structure of a printer according to a fourth embodiment of the invention. In order to prevent dew condensation, in a printer 4, the laser diode 21 is heated to the degree equal to or higher than dew point temperature by the foregoing drive current in addition to heating the laser diode 21 by the foregoing heating current. At this time, in the laser diode 21, laser oscillation is generated by the drive power. Thus, in this embodiment, a shutter 32 to block the laser light is included. The shutter 32 is arranged, for example, between the collimator lens 18 and the polygon mirror 19. The shutter 32 lets through laser light when printing is started, that is, when the photoconductive drum 14 is exposed, while the shutter 32 blocks laser light when heating is made for preventing dew condensation.

In such a printer 4, when the main power source 11 is turned on, the shutter 32 is closed under control of the control section 15, and a current equal to or higher than a threshold (drive current) is supplied from the main power source 11 to the light source module 12A. Thereby, the laser diode 21 is heated, while laser light is outputted. At this time, the laser light is blocked by the shutter 32, and thus the photoconductive drum 14 is not exposed. Timing when the shutter 32 is closed and the drive current is supplied to the light source module 12A by turning on the main power source 11 is earlier than timing when a current is applied to the other electronic parts 17 other than the light source module 12A, or both timings are concurrent, which is similar to in the first embodiment. When printing is started and the photoconductive drum 14 is exposed, the shutter 32 is opened under control of the control section 15.

Thereby, in this embodiment, dew condensation of the light source module 12A is also able to be inhibited as in the first embodiment. However, in this embodiment, the light source module 12A is heated while light is emitted by supplying a larger drive current than the foregoing heating current. Thus, temperature of the light source module 12A reaches the degree equal to or higher than dew point temperature faster than in the first to the third embodiments. Therefore, even if the printer is in lower temperature environment, quick drive of the printer 4 is enabled.

It is possible that the printer 4 includes the temperature sensor 28, the temperature sensor 29, and the humidity sensor 30 described in the second embodiment, and the light source module 12A and the shutter 32 are controlled based on the measurement results thereof.

Further, the shutter 32 is not limited to a mechanical shutter as described above, but in short, may be any device that is able to prevent laser light from reaching the photoconductive drum 14 at the time other than printing. Specifically, for example, a reflective device or a polarization device is arranged on a light path before the photoconductive drum 14, and travelling direction of the laser light is changed by such a device as appropriate.

As the reflective device, there is a device that is able to change light reflection direction with the use of, for example, MEMS (micro mechanical machine system). Such a device is arranged, for example, between the polygon mirror 19 and the collimator lens 18. That is, at the time of printing, laser light is reflected toward the polygon mirror 19, while at the time of heating the light source module 12A, laser light is reflected in other direction. Similarly, in the case where the polarization device is used, the polarization device is arranged between the polygon mirror 19 and the collimator lens 18. At the time of printing, laser light is transmitted, and at the time of heating the light source module 12A, polarization direction of the polarization device is switched to prevent transmission of laser light.

5. Modified Example

Descriptions have been hereinbefore given of the invention with reference to the embodiments. However, the invention is not limited to the foregoing embodiments, and various modifications may be made.

Figure 8:
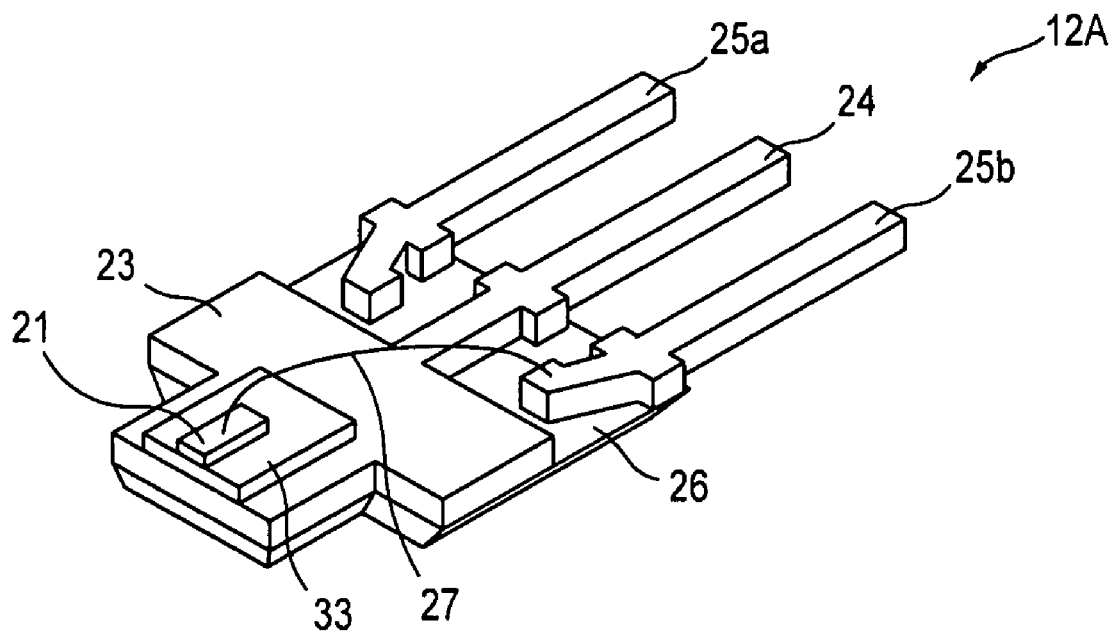
FIG. 8 is a perspective view of a light source module according to a first modified example.

In the foregoing embodiments, the description has been given of the case that the laser diode 21 is directly jointed to the die pad 23. However, as illustrated in FIG. 8, the laser diode 21 may be joined to the die pad 23 with a sub-mount 33 in between. The sub-mount 33 is used in the case where characteristics are deteriorated or reliability is lowered by heat expansion difference between the laser diode 21 and the die pad 23. As a material of the sub-mount 33, aluminum nitride, a silicon substrate, conducive copper-tungsten alloy and the like that have a heat expansion coefficient closer to that of the laser diode 21 and have favorable heat conductivity are used. For jointing the submount 33 to the die pad 23 and jointing the submount 33 to the laser diode 21, the same material as a conducive jointing material used for jointing the die pad 23 to the laser diode 21 is able to be used.

Figure 9:
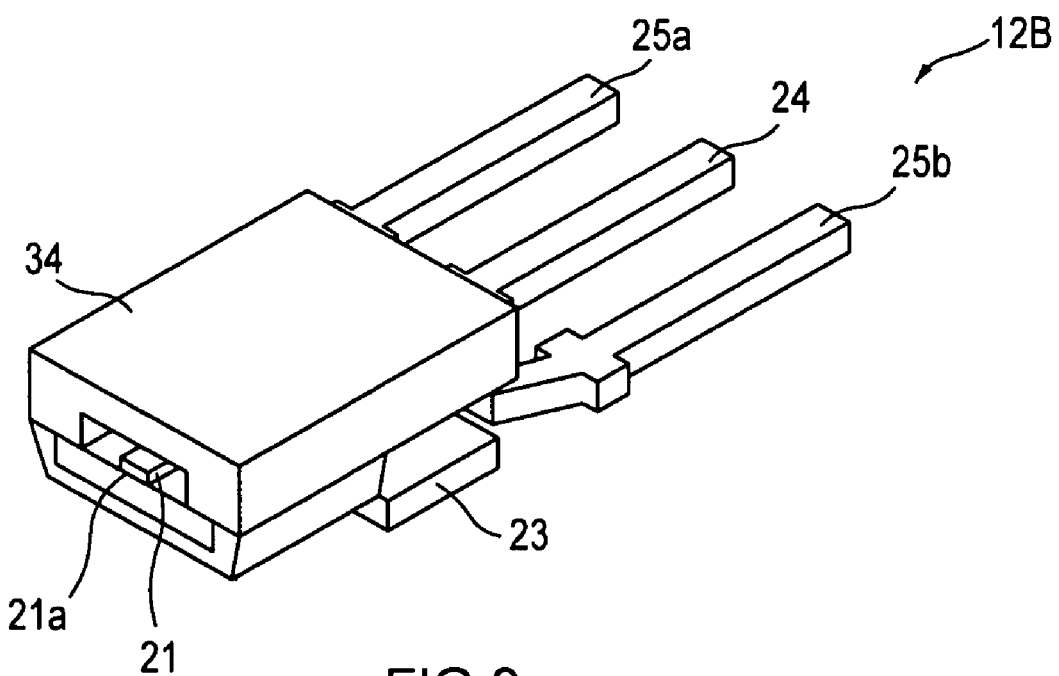
FIG. 9 is a perspective view of a light source module according to a second modified example.
Figure 10:
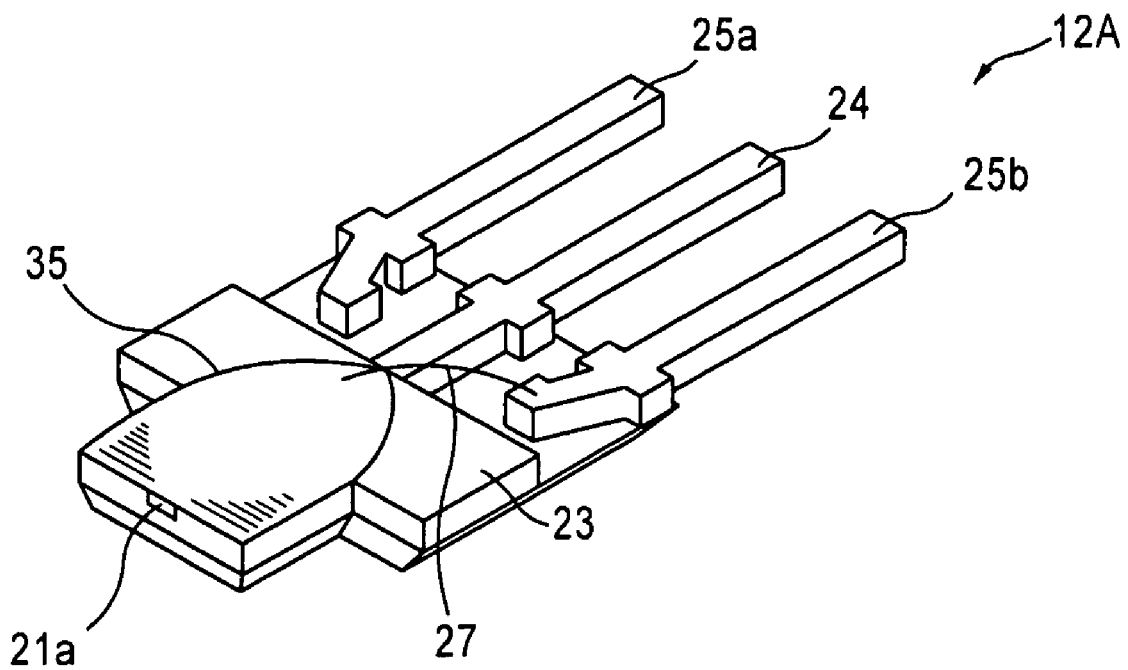
FIG. 10 is a perspective view of a light source module according to a third modified example.

Further, in order to prevent the laser diode 21 and the wire 27 from being contacted with a transport mechanism or the like at the time of handling operation and the like, a light source module 12B illustrated in FIG. 9 or a light source module 12C illustrated in FIG. 10 may be used instead of the light source module 12A. In the light source module 12B, a section other than a light emitting end face 21a of the laser diode 21 is covered with an outer frame 34. In the light source module 12C, a section other than the light emitting end face 21a of the laser diode 21 is molded with the use of a potting resin 35. In such light source modules 12B and 12C, heat conductivity of the outer frame 34 and the potting resin 35 is low, and thus in low temperature environment, heat transfer is little, and temperature is easily increased when the foregoing heating current (or drive current) is supplied.

Figure 11:
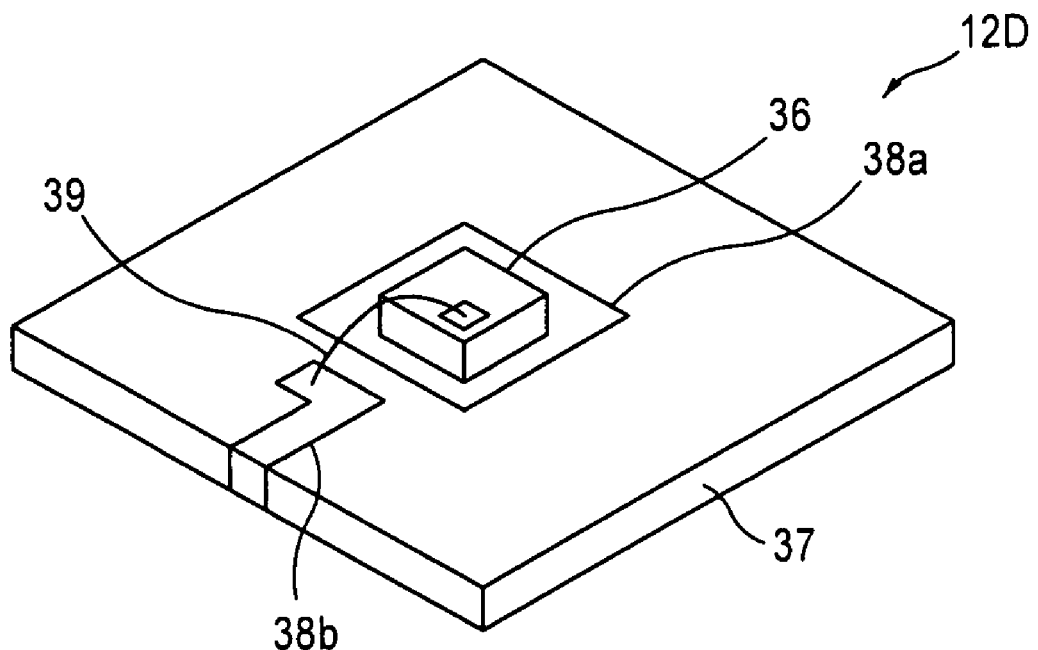
FIG. 11 is a perspective view of a light source module according to a fourth modified example.
Figure 12:
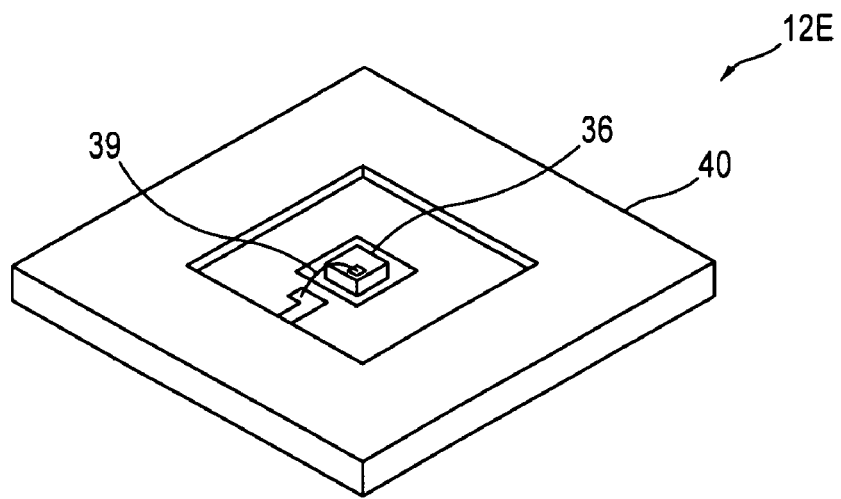
FIG. 12 is a perspective view of a light source module according to a fifth modified example.
Figure 13:
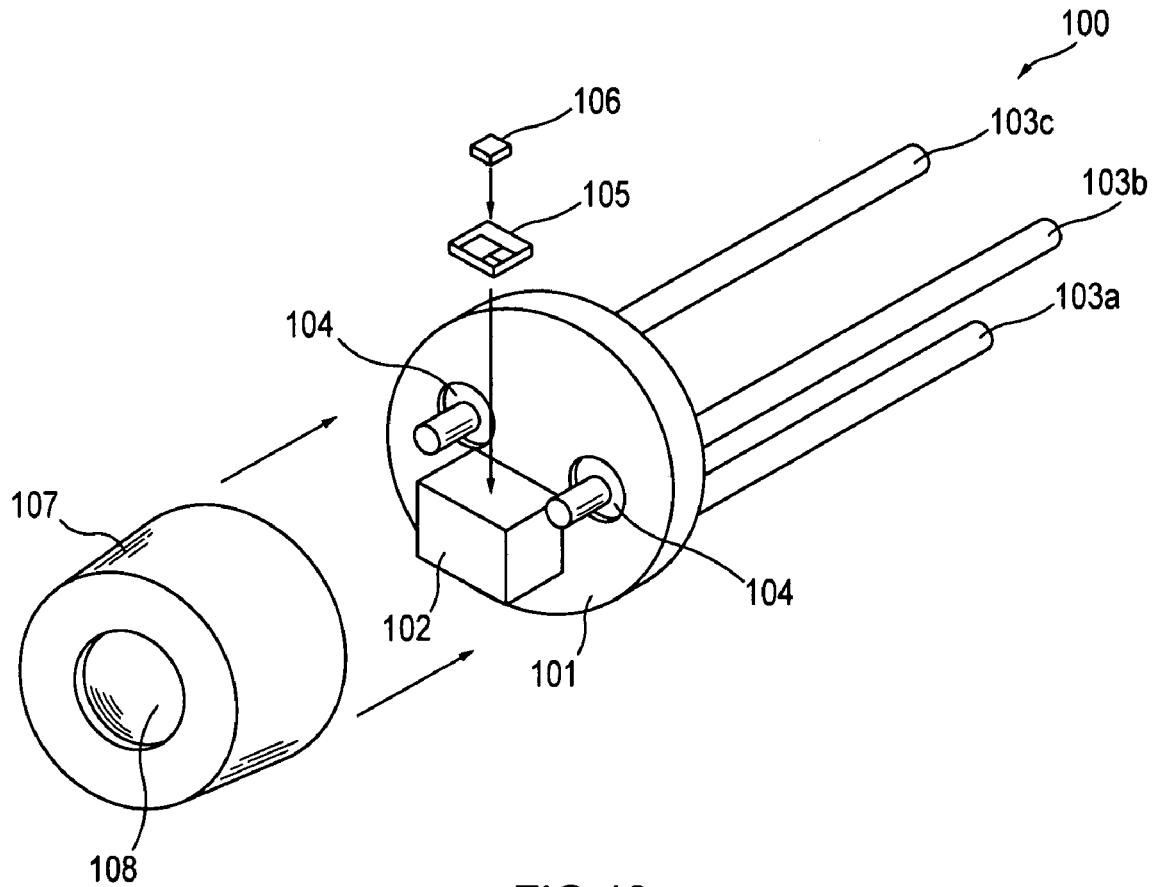
FIG. 13 is an exploded perspective view for explaining an encapsulated type package.

Further, as a light source module, not only the foregoing lead frame type package is used, but also a plate type package mounting a vertical cavity surface emitting laser diode 36 as described FIG. 11 and FIG. 12 is able to be used. A light source module 12D illustrated in FIG. 11 includes a plate 37 made of ceramics, a resin or the like. On the top face of the plate 37, two electrodes 38a and 38b are formed. One electrode 38a is extended down to the lower face through a via hole penetrating the plate 37, and the other electrode 38b is extended down to the lower face through a side face of the plate 37. The laser diode 36 is arranged on the electrode 38a. A lower face electrode of the laser diode 36 is electrically conducted to the electrode 38a, and a top face electrode of the laser diode 36 and the electrode 38b are electrically connected to a wire 39 composed of gold or the like.

A light source module 12E illustrated in FIG. 12 includes a frame section 40 made of ceramics, a resin or the like in addition to the light source module 12D illustrated in FIG. 11. The frame section 40 prevents the laser diode 36 and the wire 39 from being contacted with a transport mechanism or the like at the time of handling operation and the like. In both the light source modules 12D and 12E, their action and effect are similar to those of the foregoing embodiment, and thus the description thereof will be omitted.

In addition, in the foregoing embodiment, the description has been given of the case that the light stabilizer of the invention is applied to a printer. However, the light stabilizer of the invention is able to be applied to an electronic device other than the printer as long as the electronic device includes a light source.

The present application contains subject matter related to that disclosed in Japanese Priority Patent Application JP 2009-057681 filed in the Japan Patent Office on Mar. 11, 2009, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A light stabilizer used for an electronic device including a plurality of electronic parts and a main power source for supplying a drive current to the electronic parts, the light stabilizer comprises:

a light source operably connected to the main power source;

a heating power source operably connected to the light source, the heating power source operative to supply a heating current to the light source to make the light source self-heat in a non-light emitting state; and a control section operably connected to the main power source and the heating power source, the control section operative to execute control so that after the main power source is activated, the heating current is supplied to the light source to increase temperature of the light source equal to or higher than dew point temperature while the drive current is not supplied to the electronic parts, and, after the temperature of the light source is equal to or higher than the dew point temperature, the drive current is supplied to the electronic parts while the heating current continues to be supplied to the light source and, upon activating the electronic device, the heating power source is de-activated thus discontinuing supply of the heating current to the light source and the main power source supplies the drive current to the electronic parts and the light source, the drive current being supplied to the light source is sufficient to cause the light source to be heated to a light-emitting state.

2. The light stabilizer according to claim 1, wherein the control section executes control so that the drive current is supplied to the electronic parts other than the light source after supplying the heating current to the light source.

3. The light stabilizer according to claim 2, wherein the light source is a laser diode, and the laser diode is mounted on an open type package.

4. The light stabilizer according to claim 1 comprising:

a first temperature sensor that measures the temperature of the light source;

a second temperature sensor that measures temperature of ambient environment of the light source; and a humidity sensor that measures humidity of the ambient environment of the light source, wherein the control section adjusts a current value of the heating current so that the temperature of the light source becomes higher than the dew point temperature based on the temperatures measured by the first temperature sensor and the second temperature sensor and the humidity measured by the humidity sensor.

5. The light stabilizer according to claim 1 having an auxiliary heating section in the vicinity of the light source.

6. A light stabilization method used for an electronic device, the method comprising the steps of:

providing a plurality of electronic parts, a light source, a main power source for supplying a drive current to the electronic parts and the light source;

turning on the main power supply;

after the main power source is turned on, supplying a heating current to the light source to make the light source heat in a non-light emitting state to a temperature equal to or greater than a dew point temperature while preventing the main power source from supplying the drive current to the electronic parts;

after the temperature of the light source is equal to or higher than the dew point temperature, continuing to supply the heating current to the light source and supplying the drive current to the electronic parts; and activating the electronic device to cause discontinuation of the supply of the heating current to the light source and to cause the drive current to be supplied to the electronic parts and the light source, the drive current supplied to the light source being sufficient to cause the light source to be heated to a light-emitting state.

7. A printer comprising:

a plurality of electronic parts;

a main power source for supplying a drive current to the electronic parts;

a light source operably connected to the main power source;

a heating power source that supplies a heating current to the light source to make the light source self-heat in a non-light emitting state; and a control section operably connected to the main power source and the heating power source, the control section operative to execute control so that after the main power source is activated, the heating current is supplied to the light source to increase temperature of the light source equal to or higher than dew point temperature while the drive current is not supplied to the electronic parts, and, after the temperature of the light source is equal to or higher than the dew point temperature, the drive current is supplied to the electronic parts while the heating current continues to be supplied to the light source and, upon activating the printer, the heating power source is de-activated thus discontinuing supply of the heating current to the light source and the main power source supplies the drive current to the electronic parts and the light source, the drive current being supplied to the light source is sufficient to cause the light source to be heated to a light-emitting state.

* * * * *

UNITED STATES PATENT AND TRADEMARK OFFICE
CERTIFICATE OF CORRECTION

| | | |
|---|---|---|
| PATENT NO. | : 8,405,699 B2 | Page 1 of 1 |
| APPLICATION NO. | : 12/659002 | |
| DATED | : March 26, 2013 | |
| INVENTOR(S) | : Yoshiaki Niwa et al. | |

It is certified that error appears in the above-identified patent and that said Letters Patent is hereby corrected as shown below:

On the title page, Item (30) should read:

Mar 11, 2009   (JP) ..........................................2009-057681

Signed and Sealed this
Second Day of July, 2013

Teresa Stanek Rea
*Acting Director of the United States Patent and Trademark Office*